US006836236B2

(12) United States Patent
Horie

(10) Patent No.: US 6,836,236 B2
(45) Date of Patent: Dec. 28, 2004

(54) DIGITAL TO ANALOGUE CONVERTER AND ANALOGUE TO DIGITAL CONVERTER USING THE SAME

(75) Inventor: Masakiyo Horie, Gamagoori (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/737,751

(22) Filed: Dec. 18, 2003

(65) Prior Publication Data

US 2004/0125005 A1 Jul. 1, 2004

(30) Foreign Application Priority Data

Dec. 25, 2002 (JP) ........................................ 2002-374526

(51) Int. Cl.$^7$ ............................ H03M 1/12; H03M 1/66
(52) U.S. Cl. .................... 341/155; 341/144; 341/172
(58) Field of Search ................................. 341/155, 144, 341/172, 156, 120, 133, 166, 118, 150; 375/232

(56) References Cited

U.S. PATENT DOCUMENTS

| | | | | |
|---|---|---|---|---|
| 4,200,863 A | * | 4/1980 | Hodges et al. ............... | 341/156 |
| 4,399,426 A | * | 8/1983 | Tan .............................. | 341/120 |
| 4,611,195 A | * | 9/1986 | Shosaku ....................... | 341/133 |
| 4,764,753 A | * | 8/1988 | Yukawa ........................ | 341/166 |
| 4,768,205 A | * | 8/1988 | Nakayama .................... | 375/232 |
| 4,799,042 A | * | 1/1989 | Confalonieri et al. ........ | 341/118 |
| 5,006,854 A | * | 4/1991 | White et al. .................. | 341/172 |
| 5,138,319 A | * | 8/1992 | Tesch ........................... | 341/156 |
| 5,162,801 A | * | 11/1992 | Powell et al. ................ | 341/150 |
| 5,274,376 A | * | 12/1993 | Phillips et al. ............... | 341/150 |
| 5,675,340 A | * | 10/1997 | Hester et al. ................ | 341/156 |
| 5,949,362 A | * | 9/1999 | Tesch et al. ................. | 341/144 |
| 5,977,899 A | * | 11/1999 | Adams ......................... | 341/145 |
| 5,982,317 A | * | 11/1999 | Steensgaard-Madsen .... | 341/143 |
| 6,154,162 A | * | 11/2000 | Watson et al. ............... | 341/150 |
| 6,271,783 B1 | * | 8/2001 | Cairns et al. ................ | 341/144 |
| 6,320,530 B1 | | 11/2001 | Horie | |
| 6,448,911 B1 | * | 9/2002 | Somayajula ................. | 341/120 |
| 6,473,021 B1 | * | 10/2002 | Somayajula et al. ........ | 341/172 |
| 6,496,131 B2 | * | 12/2002 | Yoshinaga ................... | 341/150 |
| 6,600,737 B1 | * | 7/2003 | Lai et al. ..................... | 370/352 |

FOREIGN PATENT DOCUMENTS

JP           2001-53610           2/2001

OTHER PUBLICATIONS

"A 12–b, 10–MHz, 250–mW CMOS A/D Converter", Ahn et al, IEEE Journal of Solid–State Circuits, vol. 31 No. 12 pp. 2030–2035 (Discussed on page 1 in the spec.), Dec. 1996.
"A 10–b 15–MHz CMOS Recycling Two–Step A/D Converter", Song et al, IEEE Journal of Solid–State Circuits. vol. 25 No. 6 pp. 1328–1338, Dec. 1990.

* cited by examiner

*Primary Examiner*—Jean Bruner Jeanglaude
(74) *Attorney, Agent, or Firm*—Posz & Bethards, PLC

(57) ABSTRACT

An object of the present invention is to obtain a high A/D or D/A conversion accuracy, even when there exists a slope in the insulating layer film thickness distribution of the capacitors. The DAC comprises: a capacitor array for storing electric charges in accordance with a digital voltage signal; and an operational amplifier of which input terminal is connected with the capacitor array and amplifies a voltage which corresponds to the electric charges. Here, the capacitor array comprises a plurality of unit capacitors which comprises $2^n$ divisional capacitors which are of the same shape and are connected in parallel. The divisional capacitors are linearly disposed in mirror symmetry about a center line of the capacitor array and one half of the divisional capacitors every unit capacitor is disposed at one side of the center line and another half is disposed at the another side of the center line.

24 Claims, 18 Drawing Sheets

Cia, Cib (i=0, ..., 31), CFa, CFb, CFc, CFd: DIVISIONAL CAPACITORS
6: COMMON LINE

C0~C31, CF0, CF1: UNIT CAPACITORS

FIG. 19

$$\sum_{i=0}^{31} C_i \cdot V_{in} = \sum_{i=0}^{n1-1} C_i \cdot V_{ref} + C_F \cdot V_{out} \quad \cdots\cdots \text{Eq. (1)}$$

where if n1=0, then $$\sum_{i=0}^{n1-1} C_i = 0$$

FIG. 20

$$V_{out} = \underbrace{\frac{1}{C_F} \sum_{i=0}^{31} C_i}_{= g1} \cdot \underbrace{\left( V_{in} - \frac{\sum_{i=0}^{n1-1} C_i}{\sum_{i=0}^{31} C_i} \cdot V_{ref} \right)}_{= g2} \quad \cdots\cdots \text{Eq. (2)}$$

FIG. 21

$$V_{out} = \frac{1}{C_{Fa}+C_{Fb}+C_{Fc}+C_{Fd}} \cdot \sum_{i=0}^{31}(C_{ia}+C_{ib}) \cdot \left( V_{in} - \frac{\sum_{i=0}^{n1-1}(C_{ia}+C_{ib})}{\sum_{i=0}^{31}(C_{ia}+C_{ib})} \cdot V_{ref} \right)$$

$$\cdots\cdots \text{Eq. (3)}$$

DIGITAL TO ANALOGUE CONVERTER AND ANALOGUE TO DIGITAL CONVERTER USING THE SAME

BACKGROUND OF THE INVENTION

1. Field of the Invention

The present invention relates to a Digital to Analogue converter provided with a capacitor array and an Analogue to Digital using the above-mentioned D/A converter.

2. Description of the Related Art

In general, the principle of electric charges distribution in an capacitor array is utilized in an A/D converter and D/A converter of the CMOS IC. For example, there is disclosed in JP2001-53610A a three step cyclic A/D converter employing a multiplying D/A converter. Further, there is disclosed a two step cyclic A/D converter employing a multiplying D/A converter in IEEE JOURNAL OF SOLID-STATE CIRCUITS, 1996 December, Vol. 31, No. 12, p.2030–2035, "A 12-b, 10 MHz, 250 mW CMOS A/D converter", G. C. Ahn et al.

FIG. 17 is a circuit diagram of a conventional two step cyclic A/D converter (ADC) with multiplying D/A converter (MDAC) similar to that as disclosed in the above-mentioned TEEE article. The ADC 1 comprises: a 5-bit ADC 2; a capacitor array 3 comprising capacitors C0, C1, . . . , C31 and CF; switches SW0, SW1, . . . , S31 and SF connected with each electrode of C0, C1, . . . , C31 and CF, respectively; a switch S32; and an adder 5.

Capacitance values of C0, C1, . . . and C31 are "C", while a capacitance value of CF is "2C". On an actual semiconductor chip, CF is a parallel connection of CF0 and CF1 of which capacitance values are "C". ADC 2 executes a 5-bit A/D conversion twice and the adder 5 adds a conversion code "n1" of the first A/D conversion and conversion code "n2" of the second A/D conversion, thereby obtaining a 9-bit A/D conversion.

FIG. 18 shows an exemplary arrangement of the capacitor array, wherein a common line connected with common electrodes of C0, C1, . . . , C31, CF0 and CF1 is easily disposed without adjoining or crossing other lines, thereby reducing a parasitic capacitance between the common line 6 and other lines and reducing a degradation in a conversion accuracy.

Here, regarding a structure of the capacitors, it may be a $SiO_2$ layer between poly-Si layers, or an inter-layer film between adjacent Al wiring layers among multi-layer wiring layers. The capacitance values of the capacitors are not made perfectly the same, because it is difficult to make a thickness of $SiO_2$ or inter-layer film perfectly uniform over the entire semiconductor chip.

Further, the linearly arranged capacitors as shown in FIG. 18 is affected by the film thickness distribution on the semiconductor chip, because the capacitor array becomes inevitably long. Thus, the non-linearity error and differential non-linearity error in the D/A or A/D conversion are increased.

SUMMARY OF THE INVENTION

An object of the present invention is to provide a D/A converter (DAC) and A/D converter (ADC) using the same wherein a high conversion accuracy is obtained, even when there exists a slope in an insulator film thickness distribution of capacitors for a capacitor array connected both with an A/D conversion circuit of an ADC and operational amplifier of a DAC.

The DAC of the present invention comprises: a capacitor array for storing electric charges in accordance with a digital voltage signal; and an operational amplifier of which input terminal is connected with the capacitor array and amplifies a voltage which corresponds to the electric charges.

Here, the capacitor array comprises a plurality of unit capacitors which comprises $2^n$ divisional capacitors which are of the same shape and are connected in parallel, where "n" is a prescribed natural number.

Concretely, the DAC of the present invention includes fundamental seven Features as stated below.

Feature 1 resides in that the divisional capacitors are linearly disposed in mirror symmetry about a center line perpendicular to a longitudinal direction of the linear disposition of the capacitors; and one half of the divisional capacitors every the unit capacitor is disposed at one side of the center line and another half of the divisional capacitors is disposed at the another side of the center line.

According to Feature 1, when there exists a slope in the insulator film thickness distribution of the capacitors, the capacitance values of the divisional capacitors disposed at both sides of the center line are shifted by an equal quantity and moreover in the opposite direction with each other about the center line. Therefore, this is equivalent to such an arrangement that all the unit capacitors are formed on the center line. Accordingly, even when the insulator film thickness of the capacitance changes in a constant rate along the capacitor arrangement direction, the electric charge re-distribution error which causes the D/A conversion error can be made zero, theoretically. Even if the slope of the film thickness distribution function is not constant, the electric charge re-distribution error can be reduced as far as a linear approximation of the film thickness distribution function is employed.

Feature 2 resides in that the divisional capacitors are arranged in a plurality of rows and in center symmetry about a center point of the capacitor array.

According to Feature 2, similarly to Feature 1, the capacitance values of the divisional capacitors disposed at both sides of the center point are shifted by an equal quantity and moreover in the opposite direction with each other about the center point. Therefore, this is equivalent to such an arrangement that all the unit capacitors are formed at the center point. Accordingly, if the film thickness of the capacitor changes in a constant rate along the capacitor arrangement direction, the electric charge re-distribution error which causes the D/A conversion error can be made theoretically zero.

Feature 3 resides in that one of electrodes of each of the divisional capacitors is connected with a common line; and one half of the divisional capacitors every the unit capacitor is disposed at one side of the common line and another half of the divisional capacitors is disposed at the another side of the common line.

According to Feature 3, the arrangement length as a whole is shortened half, because the divisional capacitors are disposed at both sides of the common line. Accordingly, the capacitance deviation due to, e.g., a non-uniformity of etching and so on is reduced. Further, an increase in a capacitance due to a wiring between the divisional capacitors and common line is suppressed as small as possible.

Feature 4 resides in that dummy capacitors are disposed at edges or sides of the capacitor array.

According to Feature 4, the electrical conditions of the divisional capacitors are made uniform inside and outside the capacitor array, thereby reducing capacitance deviations of the divisional capacitors disposed at the edges or periphery of the capacitor array.

Feature 5 resides in that: (1) one of electrodes of each of the divisional capacitors for the electric charge re-distribution is connected with a common line; another electrode of each of the divisional capacitors is selectively connected with a prescribed reference voltage terminal or ground voltage terminal, in accordance with the digital voltage; and (2) another set of unit capacitors connected with an input terminal of the operational amplifier are provided for determining an D/A conversion gain.

According to Feature 5, a multiplying DAC is constructed.

Feature 6 resides in that the divisional capacitors for the electric charge redistribution are classified into "k" capacitors of which capacitance values are C, C, 2C, ..., $2^{(k-1)}$C, where "C" is a prescribed capacitance and "k" is a bit number of the digital voltage signal.

According to Feature 6, a number of switches for the electric charge re-distribution is reduced.

Feature 7 resides in that ADC is provided by using the above-mentioned DAC.

The ADC comprises: an A/D conversion circuit for converting an input voltage into a digital voltage; a capacitor array for storing electric charges in accordance with the input voltage; and an operational amplifier for converting a voltage corresponding to the electric charges into an analogue voltage. Here, one-side electrodes of the unit capacitors are selectively connected with a prescribed reference voltage terminal or ground voltage terminal in accordance with the digital voltage, while the other-side electrodes of the unit capacitors are connected with an inverting terminal of the operational amplifier. The A/D conversion circuit converts the input voltage into the digital voltage on the basis of the prescribed reference voltage.

According to Feature 7, a high accuracy ADC is obtained.

Furthermore, another Feature resides in that the above-mentioned divisional capacitor may comprises a plurality of sub-divisional capacitors which are of another same shape and connected in series.

In general, it is advantageous for the high speed conversion to reduce the capacitance. However, if a capacitor area is made smaller in order to reduce its capacitance, the accuracy of the capacitance values are apt to be lowered due to random fluctuations in the capacitance values caused by accuracy in manufacturing processes.

The above-mentioned series connection of the sub-divisional capacitors has an advantage that the capacitance of the divisional capacitor is reduced without wotiout employing a small area capacitor.

According to the above-mentioned another Feature, the DAC or ADC becomes of high speed, without sacrificing the accuracy of each divisional capacitor.

Still another Feature resides in that the capacitor array may be a parallel connection of the divisional capacitors each of which comprises above-mentioned sub-divisional capacitors.

According to the above-mentioned still another Feature, the DAC or ADC does not only become of high speed, but also the conversion error is reduced by employing the mirror symmetry arrangement or common centroid arrangement, as already explained.

BRIEF EXPLANATION OF THE DRAWINGS

FIG. 19 shows Eq. (1) (an equation of conservation of electric charge before and after a re-distribution of electric charges) in terms of the output voltage Vout from the ADC of Embodiment 1.

FIG. 20 shows Eq. (2) expressing Vout derived from Eq.(1).

FIG. 21 shows Eq. (3) (modified Eq. (2)) expressing Vout.

PREFERRED EMBODIMENT OF THE INVENTION

Figure 1:
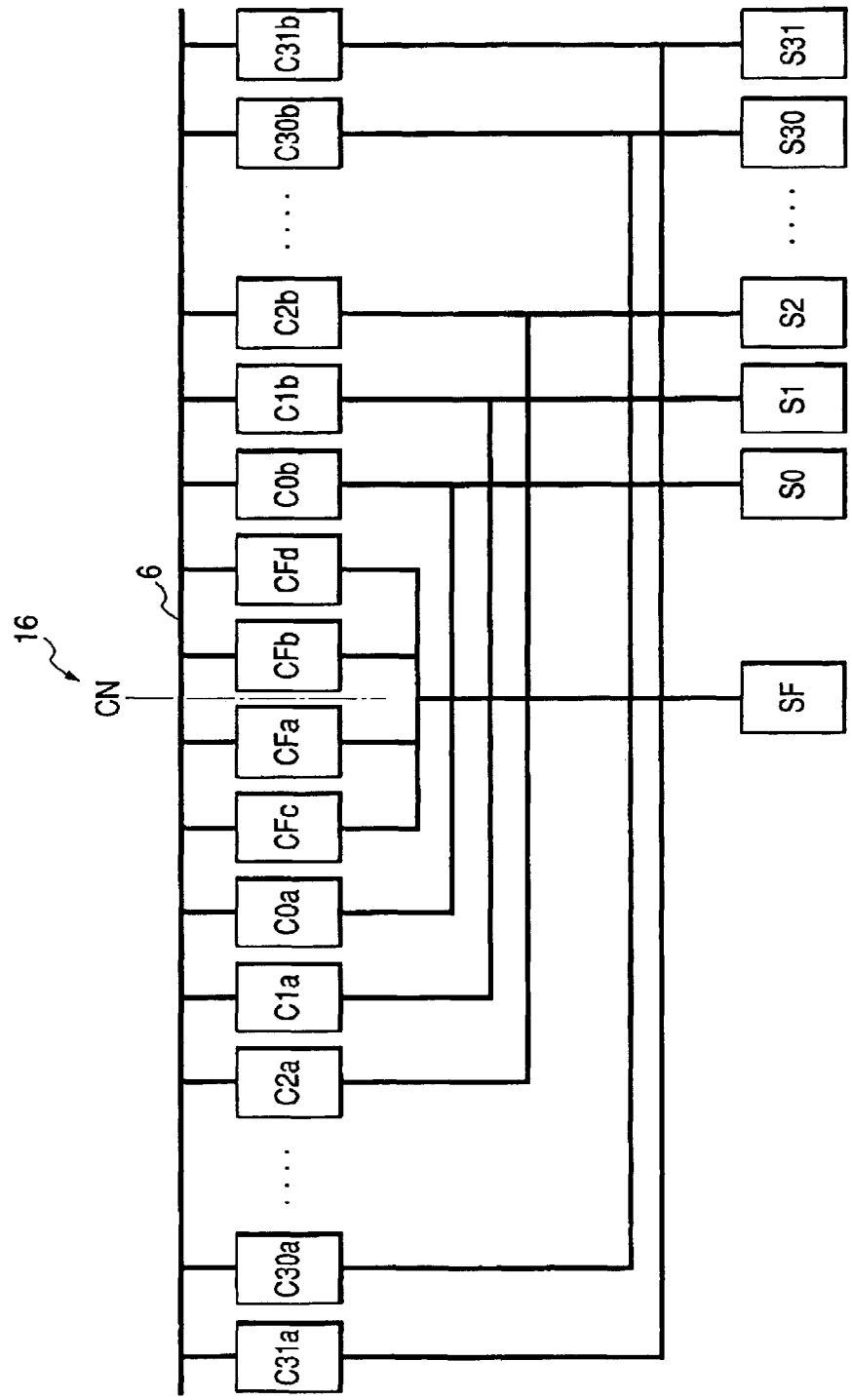
FIG. 1 is an illustration of a capacitor arrangement wherein a conversion error can be completely eliminated, even when there exists a slope in the capacitor film thickness distribution, for Embodiment 1 of the present invention.

Preferred Embodiments of the present invention are explained, referring to the drawings.

Embodiment 1

Figure 2:
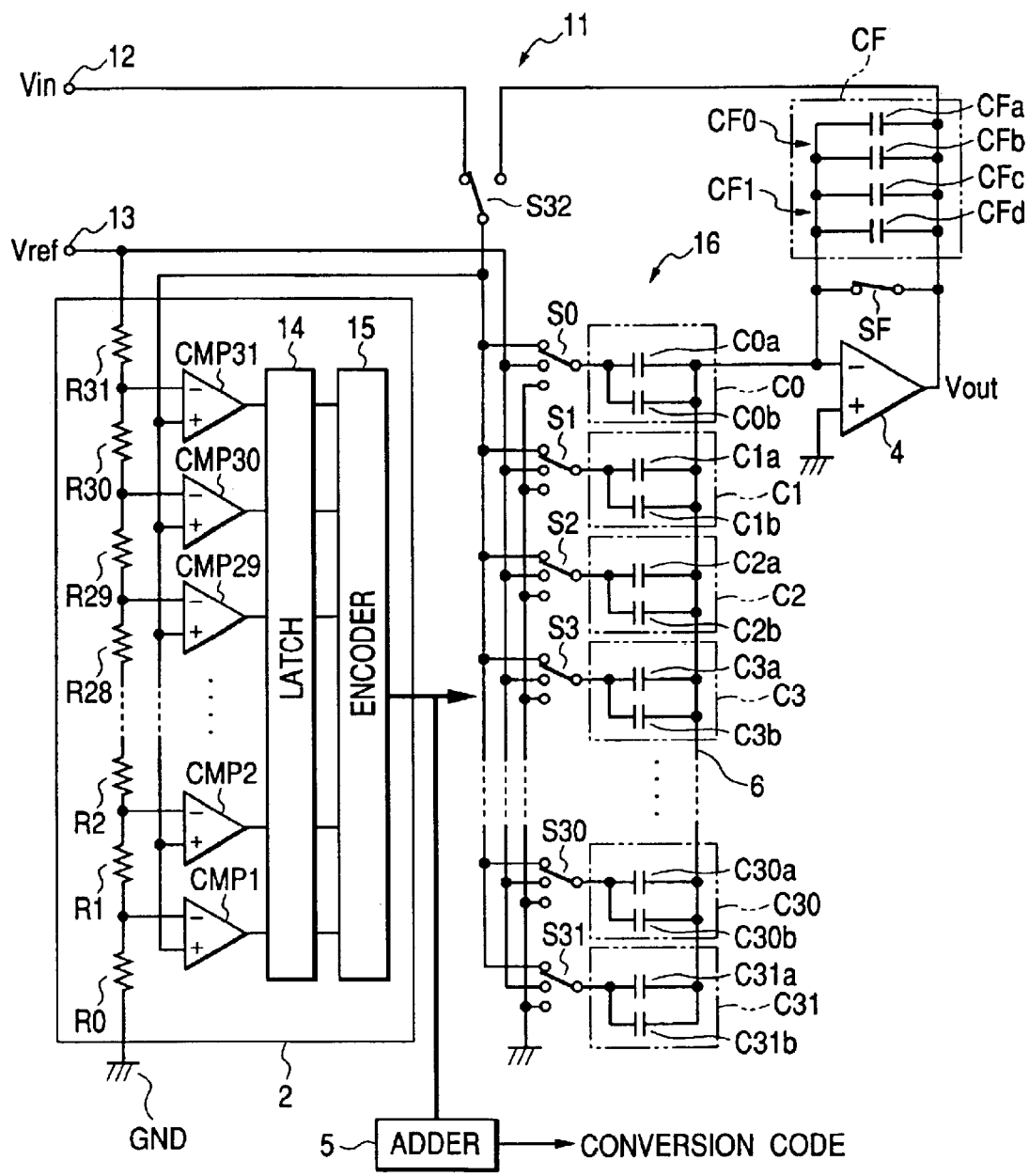
FIG. 2 is a circuit diagram of a two step cyclic Analogue to Digital converter (ADC) of Embodiment 1.
Figure 17:
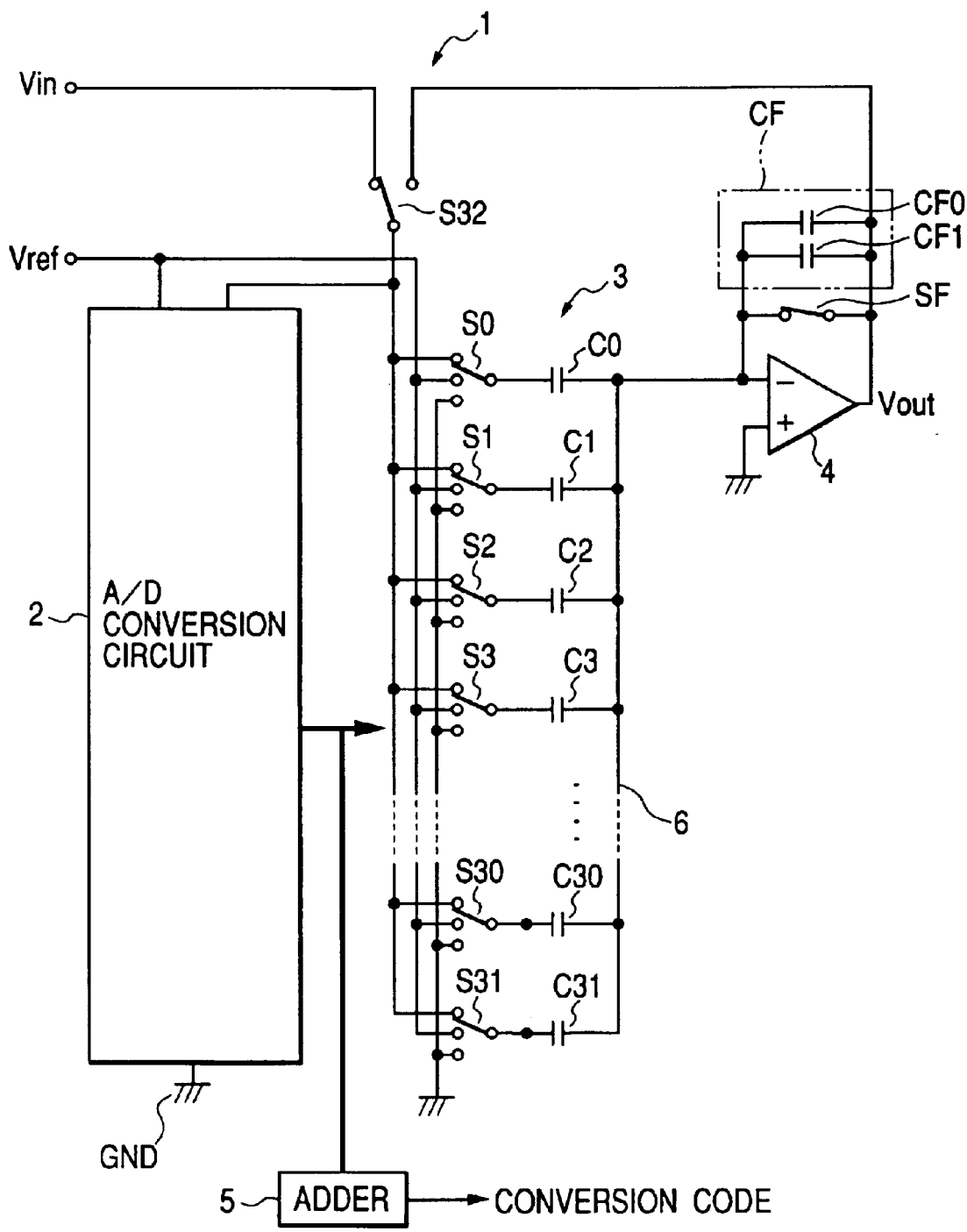
FIG. 17 is a circuit diagram of a conventional two step cyclic A/D converter (ADC) with a multiplying D/A converter (MDAC).

FIG. 2 is a circuit diagram of a CMOS two step cyclic Analogue to Digital converter (ADC) 11, wherein the same reference numerals are given to the same elements as shown in FIG. 17. The input terminal of the 5-bit Analogue to Digital conversion circuit 2 of the parallel type (flash type) as shown in FIG. 17 is selectively connected through a switch S32 either with a input voltage terminal 12 for inputting a signal to be converted, or with an output terminal of an operational amplifier 4. Further, a high voltage side of the A/D conversion circuit 2 is connected with a reference voltage terminal 13 for inputting a reference voltage Vref, e.g., 5 V, while its low voltage side is connected with the ground terminal. The operational amplifier 4 is operated by a single power supply of 5 V.

A series connection of resistors R0 to R31 is connected with the reference voltage terminal and ground voltage terminal GND. The connecting points of the resistors R0 to R31 are connected with inverting input terminals of comparators CMP1 to CMP31, respectively. Non-inverting input terminals of the comparators CMP1 to CMP31 are connected through S32 with an input voltage terminal 12 of the A/D conversion circuit 2.

Outputs from the comparators CMP1 to CMP31 are inputted into a latch circuit 14 for holding the outputs from the comparators CMP1 to CMP31 when a not-shown latch signal becomes high and for outputting to an encoder 15 the held outputs from the comparators CMP1 to CMP31. Then, the encoder 15: generates on the basis of the output from the latch circuit 14; and outputs, 5-bit A/D conversion code from "00000" to "11111". The 5-bit A/D conversion code is added in an adder 5.

A capacitor array 16 comprises capacitors C0 to C31, CF0 and CF1. Capacitance values of C0 to C31 are "C". CF0 and CF1 are elements constructing a capacitor CF of which capacitance is "2C". Further, unit capacitors Ci (i=0 to 31) is a parallel connection of divisional capacitors Cia and Cib, while a unit capcitor CF0 is a parallel connection of divisional capacitors CFa & CFb and unit capacitor CF1 is a parallel connection of divisional capacitors CFc and CFd.

As shown in FIG. 1, the divisional capacitors CFa, CFc, C0a to C31a are arranged in mirror symmetry with the divisional capacitors CFb, CFd, C0b to C31b. The mirror surface is shown by a center line CN at the center of the linearly arranged capacitors C31a, C30a, . . . , C30b and C31b in the capacitor array 16.

Concretely, CFa is disposed at the left hand side of CN, while CFb is disposed at the right hand side of CN. Further, CFc is disposed at the left hand side of CFa, while CFd is disposed at the right hand side of CFb. Further, C0a is disposed at the left hand side of CFc, while C0b is disposed at the right hand side of CFd. Similarly, C1a to C31a are disposed in this order at the left hand side of CN, while C1b to C31b are disposed in this order at the right hand side of CN. C31a is the outside-most capacitor in the left hand side of CN, while C31b is the outside-most capacitor in the right hand side of CN. The switch S0 to S31 are disposed parallel to and moreover adjacent to C0b to C31b, respectively, on the another electrode sides of C0b to C031 which are not connected with the common line 6.

Next, the ADC 11 is explained, referring to FIG. 2.

When the adder 5 is cleared and then A/D conversion start signal is inputted, S32 is connected with input terminal 12 and A/D conversion circuit 2 starts the first step A/D conversion of input signal Vin. The output signals from the CMP1 to CMP31: are decided by the first A/D conversion; held on the basis of a latch signal in the latch circuit 14; inputted into the encoder 15; and outputted as a 5-bit A/D conversion code "n1" which is added in the adder 5.

Simultaneously with the first A/D conversion, SF is turned on and moreover S0 to S31 are connected with the input terminal 12, whereby the lower electrodes of C0 to C31 are grounded, while the upper electrodes of C0 to C31 are connected with the input terminal 12. Thus, C0 to C31 are charged up by Vin, while the electric charges of CF is initialized to zero.

Then, when "n1" is latched and moreover SF is completely turned off, S0 to S31 is connected with the reference voltage terminal 13 or ground (GND) terminal, in accordance with "n1".

The above-mentioned switching of S0 to S31 depends upon the A/D conversion code "n1" in such a manner that:
if "n1" is "00000", then, all of S0 to S31 are connected with the GND terminal; if "n1" is "00001", then, one of S0 to S31, e.g., S0 is connected with the reference voltage terminal 13 and the rest are connected with the GND terminal and if "n1" is "11111", then, all of S0 to S31 are connected with the reference voltage terminal. Similar switching is executed for other digital values of "n1".

The electric charges on the common line 6 are conserved before and after the switching of S0 to S31. Therefore, after completing the switching, the operational amplifier 4 executes a feed-back control through CF in order to make the voltage of the common line 6 (inverting input terminal of the operational amplifier) zero. As a result, the electric charges are re-distributed between C0 to C31 and CF. The equation of electric charge conservation is expressed by Eq. (1) as shown in FIG. 19, where Vout is an output voltage of the operational amplifier 4.

Therefore, Vout is derived from Eq. (1) and is expressed by Eq. (2) as shown in FIG. 20.

Vout is $g1 \cdot (Vin - g2 \cdot Vref)$ as shown in Eq. (2), where "g1"=16, because CF=2C and Ci=C in Eq. (2). Here, CF determines a conversion gain of the multiplying D/A conversion. Coefficient "g2" in Eq.(2) is a ratio of a summation of Ci (i=0 to n1−1) to another summation of Cj (j=o to 31), while coefficient "g2" is a ratio of the above-mentioned another summation of Cj to CF.

Eq. (2) is rewritten in terms of capacitance values of the divisional capacitors Cia, Cib (i=0 to 31) and CFa to CFd, as a following Eq. (3) as shown in FIG. 21.

The second step A/D conversion is started, when Vout as expressed by Eq.(3) is stabilized. The second A/D conversion code "n2" is held in the latch circuit 14. Then, the adder adds "n2" to "n1" in such a manner that the LSB of "n1" is overlapped to the MSB of "n2", thereby obtaining 9-bit A/D conversion code "n". The conversion range is from 0 V to Vref.

As shown in Eq. (2), a conversion error of Vout is reduced by reducing fluctuations in "g1" and "g2", i.e, reducing relative deviations in Ci (i=0 to 31) and CF.

In general, the relative deviations in Ci (i=0 to 31) and CF are caused due to a non-uniform film thickness distribution of $SiO_2$ film between poly-Si layers or inter-layer film between Al wiring layers, on the semiconductor chip surface.

The inventor studies three types of the capacitor arrangements.

Figure 3:
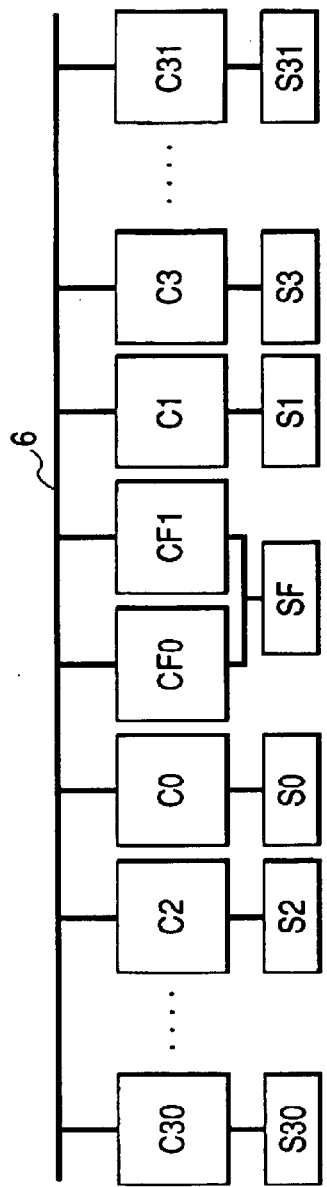
FIG. 3 is an illustration of a capacitor arrangement wherein a conversion error is small but cannot be completely eliminated, when there exists a slope in the capacitor film thickness distribution.

FIG. 3 is an illustration of one of the three capacitor arrangements, wherein C0 to C31 are linearly arranged in such a manner that: CF0 and CF1 is disposed at the center of the linear arrangement; C1, C31 . . . and C31 are disposed in this order at one side; and C0., C2 . . . and C30 are disposed in this order at another side. In accordance with the A/D conversion code, e.g., "n1", switch S0 corresponding to C0 to switch S (n1−1) corresponding to C(n1−1) are connected with the Vref terminal 13.

Figure 4:
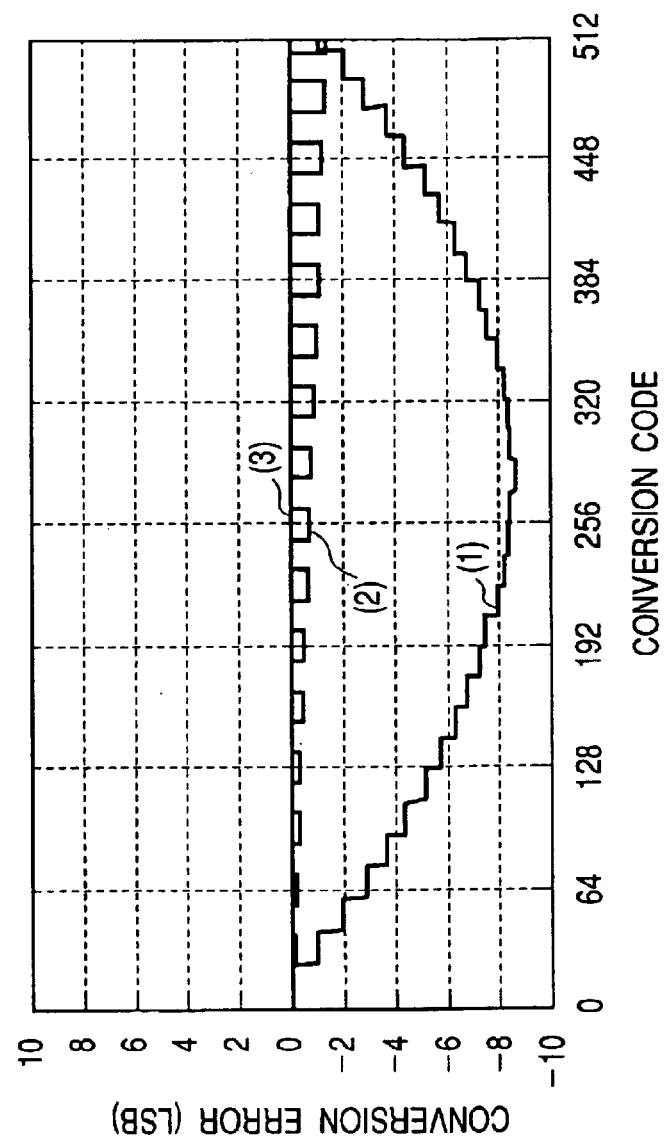
FIG. 4 shows a simulation result of the conversion error caused by the capacitor arrangement as shown in FIG. 18 (conventional), FIG. 3 and FIG. 1.
Figure 18:
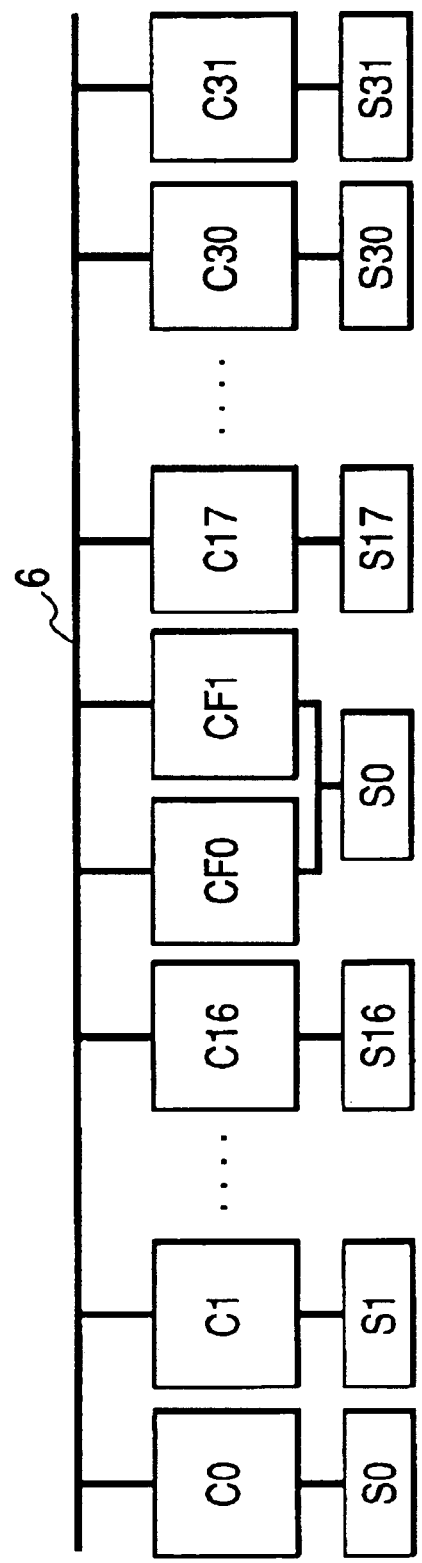
FIG. 18 is an illustration of a conventional capacitor array.

FIG. 4 shows a simulation result of a conversion error in an A/D conversion code "n", for: (1) the conventional capacitor arrangement as shown in FIG. 18; and (2) the capacitor arrangement as shown in FIG. 3. As shown in FIG. 4, for the arrangement (1), there is caused an conversion error over 8 LSB around the center of the A/D conversion code "n". On the other hand, for the arrangement (2), the conversion error remains small (about 1 LSB).

However, even for the arrangement (2) as shown in FIG. 3, the conversion error could not be made zero. Increases and decreases of the errors are repeated and the error as a whole gradually increases, as the A/D conversion code "n" increases.

Further, the inventor studied and found the cause of the conversion error.

32 irregularities in the A/D conversion codes for the arrangement (2) are caused by an error due to electric charge re-distribution in the first step A/D conversion code "n1". As the A/D conversion code "n1" is incremented by one, the upper electrode of the capacitor is switched from the ground side to the Vref side sequentially in the order from C0, C1, C2, . . . , to C31 during the re-distribution of the electric charges. The inventor noticed that distances between the present capacitor and next capacitor to be charged up become long, as the A/D conversion code "n1" increases. As shown in FIG. 3, for example, the distance between C0 and C1 is smaller than the distance between C30 and C31. Thus, the non-uniform capacitance distribution, i.e., non-uniform film distribution in the capacitor insulator film, affects greatly the conversion error.

On the contrary, in the capacitor arrangement of the present invention as shown in FIG. 1, capacitors Ci (i=0 to 31), CF0 and CF1 comprise a pair of capacitors Cia & Cib, CFa & CFb and CFc & CFd, respectively, which are arranged in mirror symmetry about CN. Therefore, the capacitance values of individual unit capacitors comprising divisional capacitor pairs shift by an equal quantity (referred to the capacitance at CN) and moreover in the opposite direction with each other, when the film thickness distribution changes linearly.

Therefore, the capacitance value deviations are cancelled in Ci, CF0 and CF1. This is equivalent to such an arrangement that Ci, CF0 and CF1 are formed on the center line CN.

The simulation result is indicated by (3) for the arrangement as shown in FIG. 1. Thus, even if the film thickness of the capacitor changes in a constant rate along the capacitor arrangement direction, the electric charge re-distribution error which causes the D/A conversion error can be made zero, theoretically. Further, even if the slope of the film thickness distribution is not constant, the electric charge re-distribution error can be reduced as far as a linear approximation of the film thickness distribution function is employed.

In the above explanation, Vin was an analogue voltage and was once converted into a digital voltage by the A/D conversion circuit 2 and once again converted into an analogue voltage by the operational amplifier 4.

However, Vin may be digital voltage. If Vin is a digital voltage in parallel or serial, Vin is inputted bit by bit into the capacitor array, is converted into an analogue voltage on the electrodes of the capacitors and amplified by the operational amplifier 4, as already explained, while the A/D conversion circuit 2 is not activated.

Thus, the circuit as shown in FIG. 2 can independently operate as DAC as well as ADC.

Embodiment 2

Figure 5:
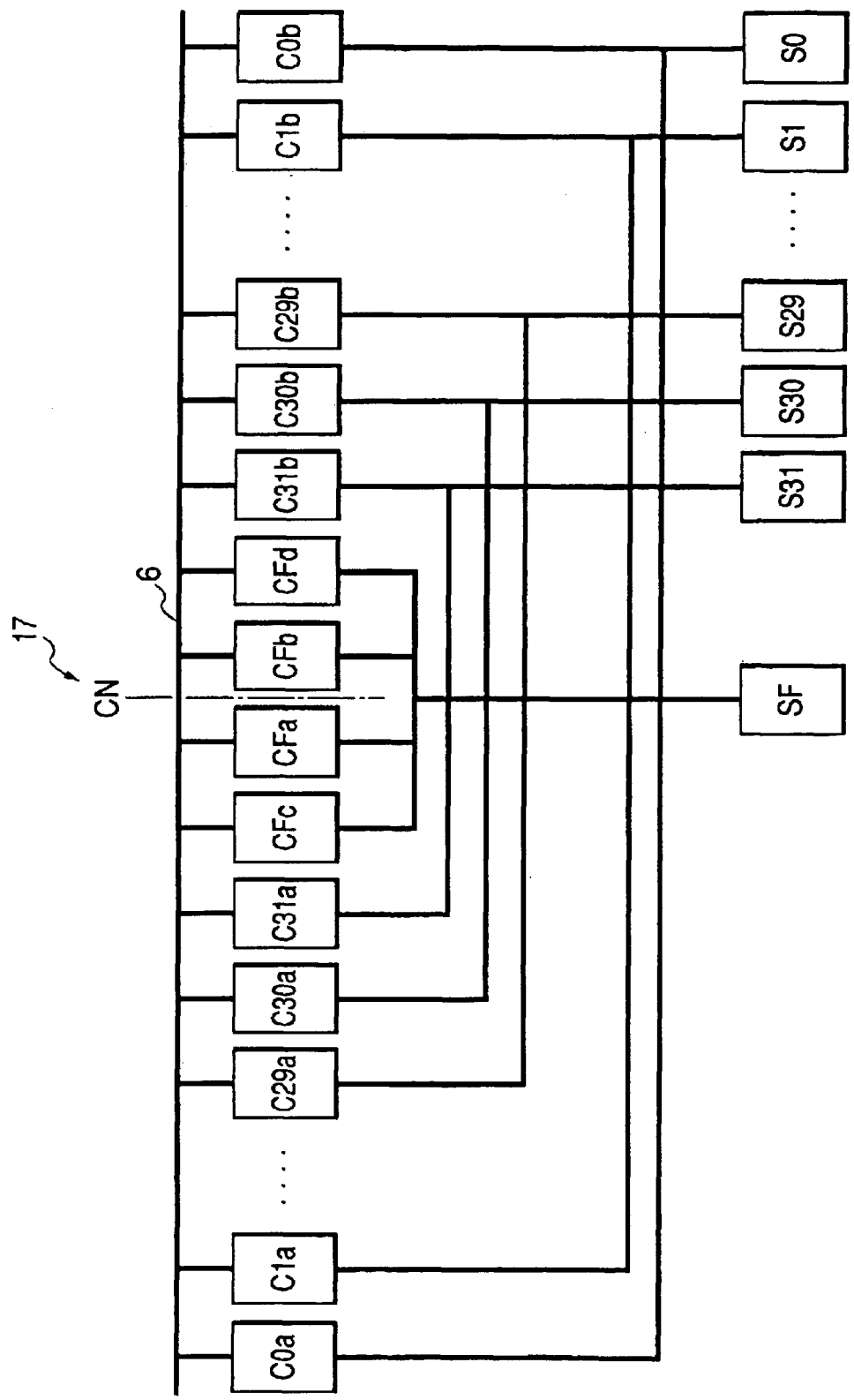
FIG. 5 is an illustration of a capacitor arrangement for Embodiment 2.

Embodiment 2 is explained, referring to FIG. 5.

The ADC of Embodiment 2 is the same as that of Embodiment 1, but the capacitor arrangement is different from that of Embodiment 1. Concretely, as shown in FIG. 5, the divisional capacitors CFa and CFc are disposed at the left and right hand sides of CN, respectively. Further, the divisional capacitor CFc is disposed at the left hand side of the divisional capacitor CFa, while the divisional capacitor CFd is disposed at the right hand side of the divisional capacitor CFb. Further, the divisional capacitors C31a to C0a in this order are disposed at the left hand side of the divisional capacitor CFc, while the divisional capacitors C31b to C0b in this order are disposed at the right hand side of the divisional capcitor CFd. Thus, divisional capacitors Cia and Cib (i=0 to 31) are disposed in an order reverse to that as shown in FIG. 1.

According to the capacitor arrangement as shown in FIG. 5, the upper electrodes of the capacitors are switched from the ground side to the Vref side during the electric charge re-distribution in an order from C0, C1, C2, . . . , C31, i.e., from the out-most capacitor to the center capacitor. Nevertheless, the capacitor deviation in a pair of Cia and Cib is cancelled similarly to Embodiment 1, thereby making the relative capacitance deviations of unit capacitors Ci, CF0 and CF1 zero theoretically.

Embodiment 3

Figure 7:
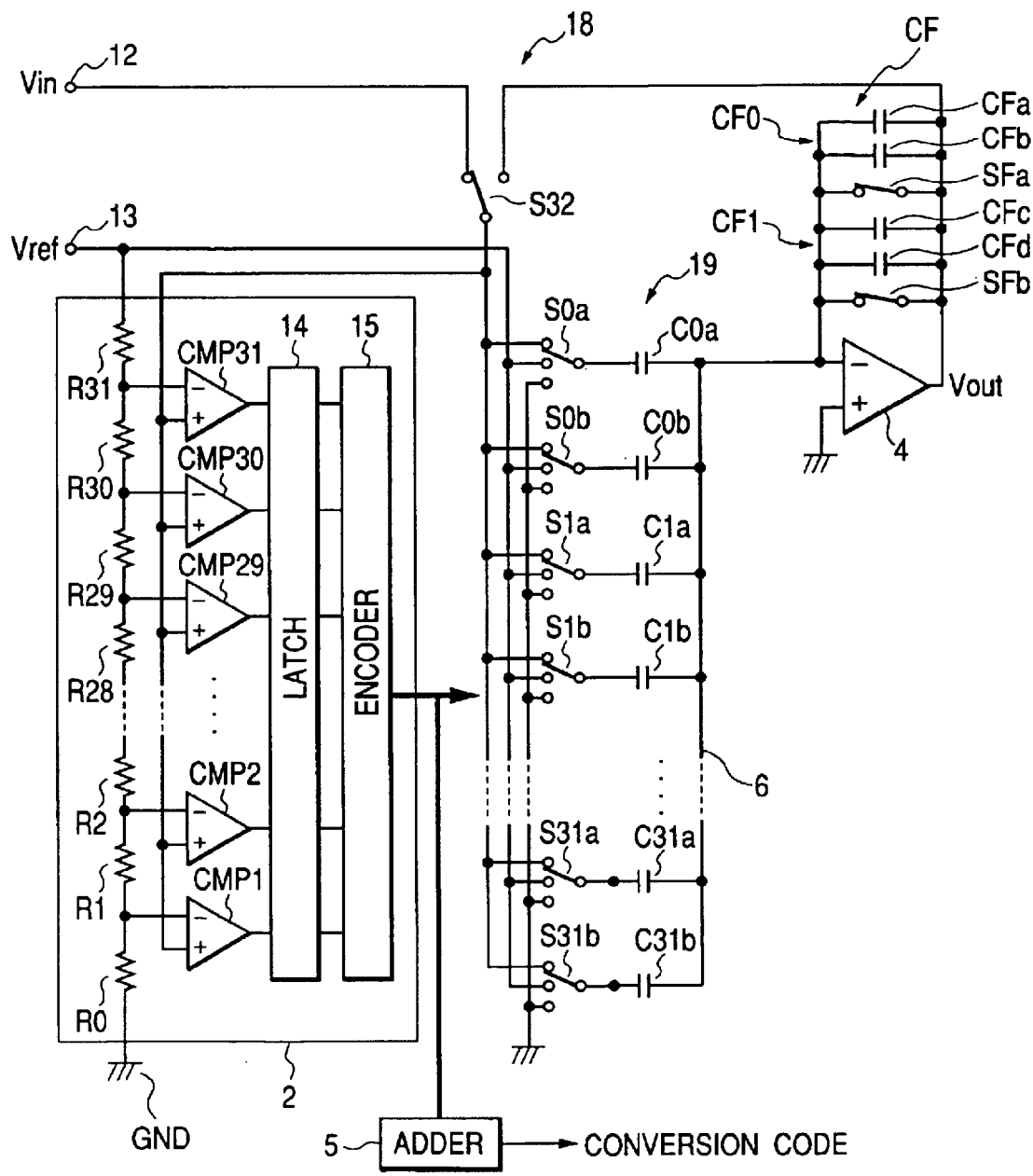
FIG. 7 is a circuit diagram of an ADC for Embodiment 3.

FIG. 7 is a circuit diagram of a two step cyclic ADC 18, wherein the same reference numerals are given to the same elements as shown in FIG. 2. A capacitor array 19 similarly to that as shown in FIG. 2 comprises the unit capacitors C0 to C31, CF0 and CF1, where Ci (i=0 31) is a parallel connection of the divisional capacitors Cia and Cib, CF0 is a parallel connection of the divisional capacitors CFa and CFb, while CF1 is a parallel connection of the divisional capacitors CFc and CFd.

However, differently from Embodiment 1, switches Sia and Sib are provided for Cia and Cib, respectively. Further, a switch SFa is provided for CFa and CFd, while a switch SFb is provided for CFb and CFc. Those switches are switched similarly to Embodiment 1.

Figure 6:
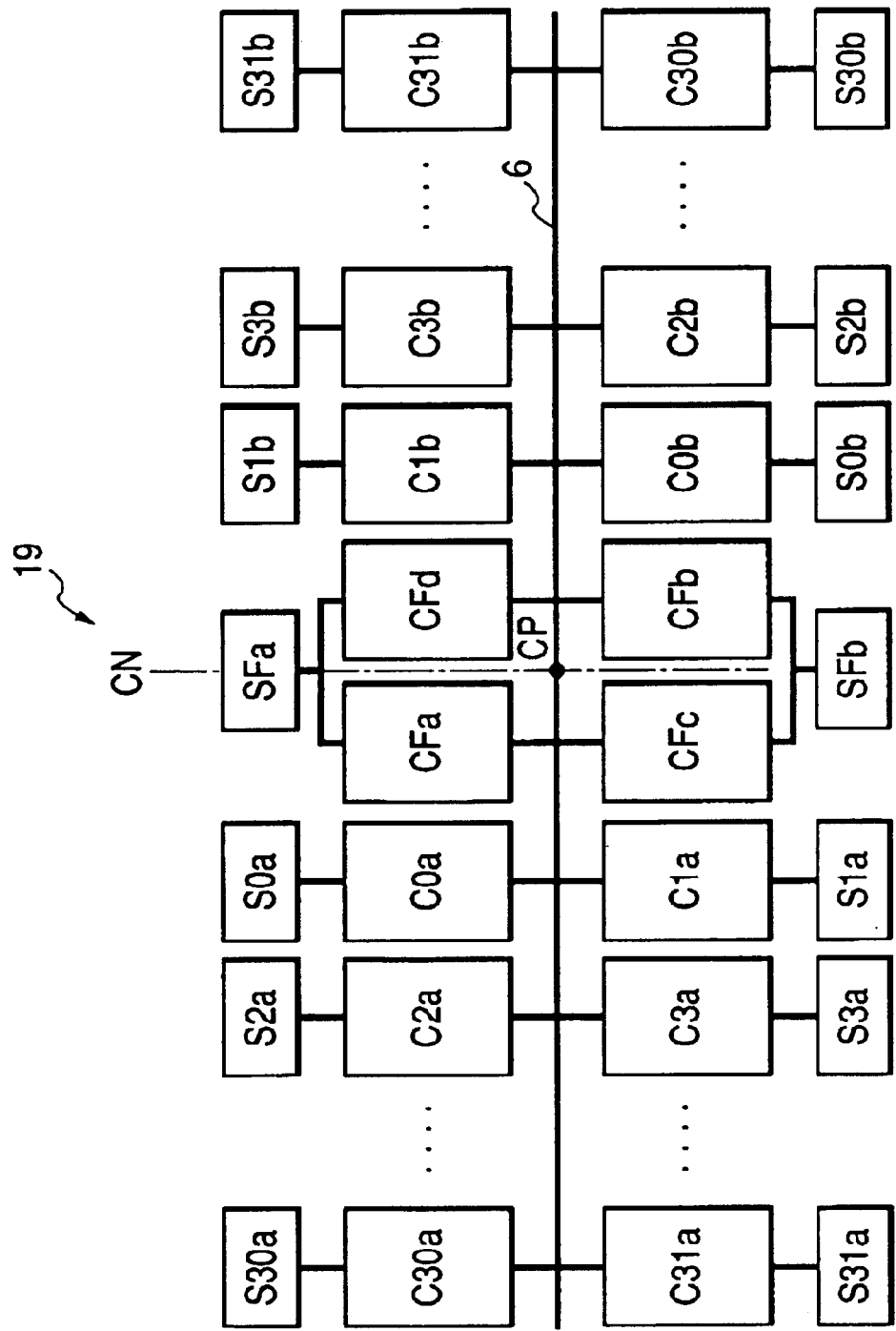
FIG. 6 is an illustration of a capacitor arrangement for Embodiment 3.

FIG. 6 illustrates an capacitor arrangement in the capacitor array 19. The capacitors are disposed both sides of the common line 6 with which the common electrodes (lower electrodes) of the capacitors are connected. Concretely, there are disposed, at one side of the common line 6, CFa and CFd between which CN is held. Further, at the one side of the common line 6, C0a, C2a, . . . , C30a in this order are disposed at the left hand side of CFa, while C1b, C3b, . . . , C31b in this order are disposed at the right hand side of CFd. Further, there are disposed, at another side of the common line 6, CFc and CFb between which CN is held. Further, at the another side of the common line 6, C1a, C3a, . . . , C31a in this order are disposed at the left hand side of CFc, while C0b, C2b, . . . , C30b in this order are disposed at the right hand side of CFb.

According to the capacitor arrangement as shown in FIG. 6, a common centroid arrangement is obtained in such a manner that C1a & Cib, CFa &CFb and CFc & CFd are disposed around a common center point CP which is an intersection point of CN with the common line 6. The switches Sia, Sib, SFa and SFb are disposed adjacently to Cia, Cib, CFa &CFd and CFc & CFb, respectively. SFa and SFb are disposed on CN.

According to the above-mentioned common centroid arrangement, the capacitance values of Cia, CFa and CFc deviate around CP, by the same values as, and in directions opposite to, those of Cib, CFb and CFCFd, respectively.

As a result, the above-mentioned capacitance deviations are cancelled in Ci, CF0 and CF1, respectively. This is equivalent to such an arrangement that Ci, CF0 and CF1 are formed at CP. Therefore, even when there exists a constant slope in the capacitor film thickness, the relative capacitor deviations between Ci, CF0 and CF1 are eliminated theoretically, thereby reducing the error curing the electric charge re-distributions which cause the A/D conversion error.

Further, according to the above-mentioned common centroid arrangement, the arrangement length as a whole is shortened half, because the capacitors are disposed at both sides of the common line 6. Accordingly, the capacitance deviation due to, e.g., a non-uniformity of etching is expected to be reduced. Further, an increase in a capacitance due to a wiring between the capacitors and common line 6 is suppressed as small as possible. Further, the wiring between the capacitors and switches is simplified, because a switch is provided for each capacitor.

Embodiment 4

Figure 8:
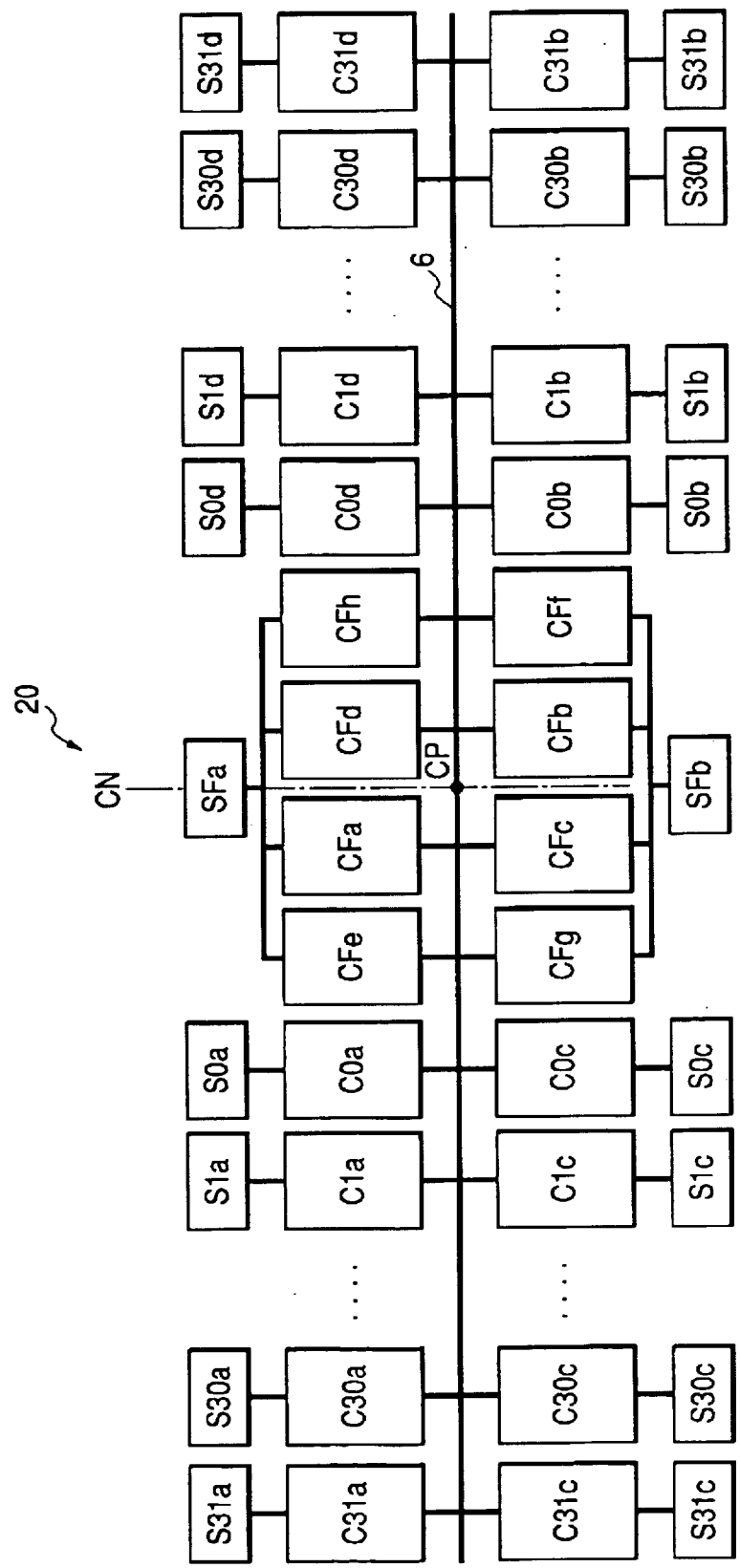
FIG. 8 is an illustration of a capacitor arrangement for Embodiment 4.

FIG. 8 is an illustration of a capacitor array 20 which is similar to Embodiment 3, but is different in that an unit capacitor comprises four ($2^2$) divisional capacitors.

That is, the unit capacitors Ci (i=0 to 31) is a parallel connection of divisional capacitors Cia, Cib, Cic and Cid; the unit capacitor CF0 is a parallel connection of divisional capacitors CFa, CFb, CFc and CFd; and the unit capacitor CF1 is a parallel connection of divisional capacitors CFe, CFf, CFg and CFh.

Cia, Cib, Cic and Cid are provided with switches Sia, Sib, Sic and Sid, respectively. CFa, CFd, CFe and CFh are provided with a common switch SFa, while CFb, CFc, CFf and CFg are provided with a common switch SFb.

The operation and advantages of the above-mentioned common centroid arrangement of Embodiment 4 is similar to those of Embodiment 3.

Embodiment 5

Figure 10:
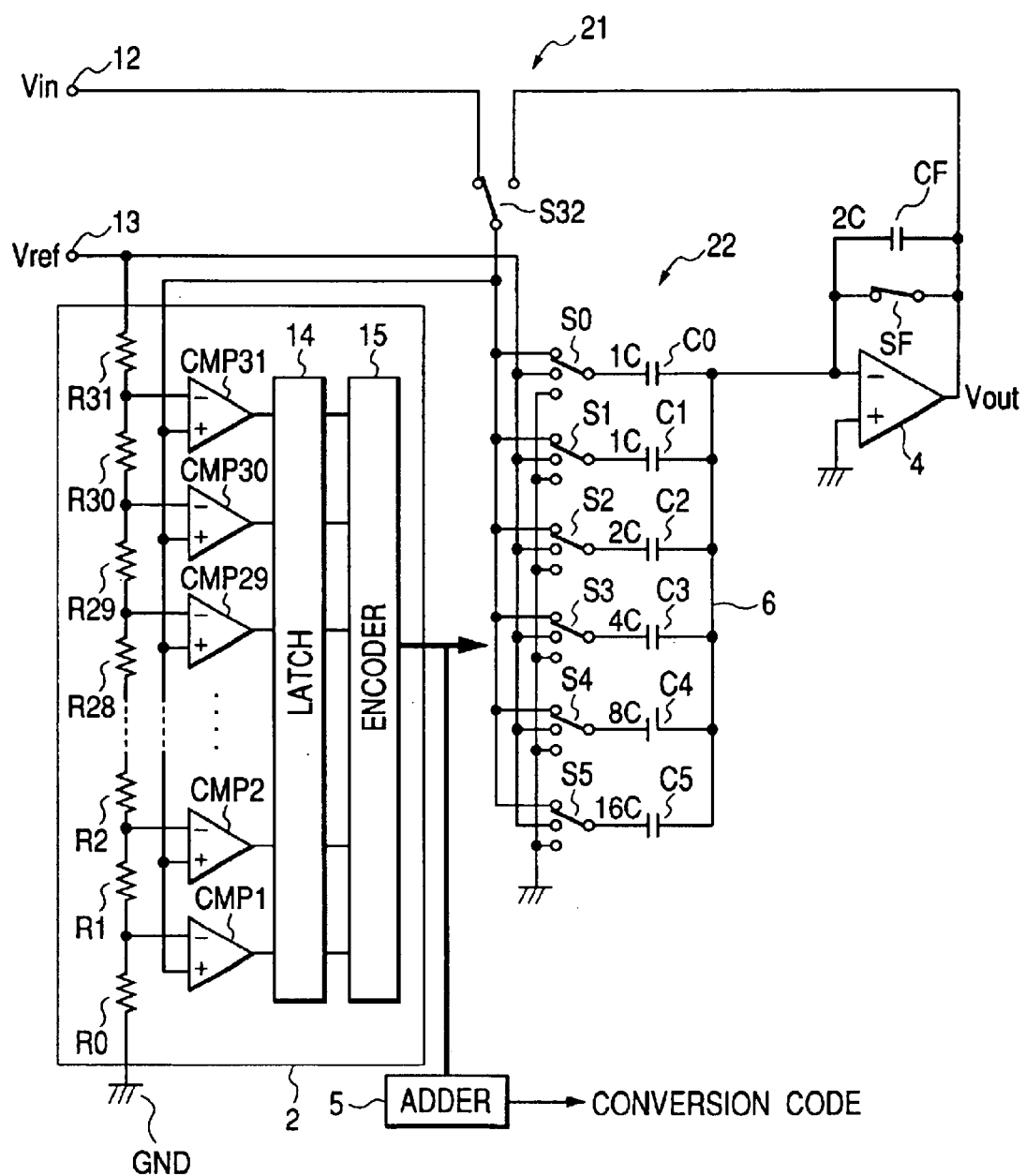
FIG. 10 is a circuit diagram of an ADC of Embodiment 5.

FIG. 10 is a circuit diagram of a CMOS two step cyclic ADC 21, wherein the similar reference numerals are given to the similar elements as shown in FIG. 2. A capacitor array 22 comprises: C0, C1, C2, C3, C4 and C5 of which capacitance values are C, C, 2C, 4C, 8C and 16 C; and the unit capacitor CF of which capacitance is 2C. Actually, C2 to C5 and CF are parallel connections of unit capacitors with capacitance of C. Further, the unit capacitors are constructed by two divisional capacitors.

Therefore, C0 and C1 are parallel connections of divisional capacitors C0a & C0b, C1a & C1b, respectively; C2 is a parallel connection of four divisional capacitors C2a, C2b, C2c and C2d; CF is a parallel connection of four divisional capacitors CFa, CFb, CFc and CFd; and similarly, C3, C4 and C5 are parallel connections of 8, 16, 32 divisional capacitors, respectively.

Figure 9:
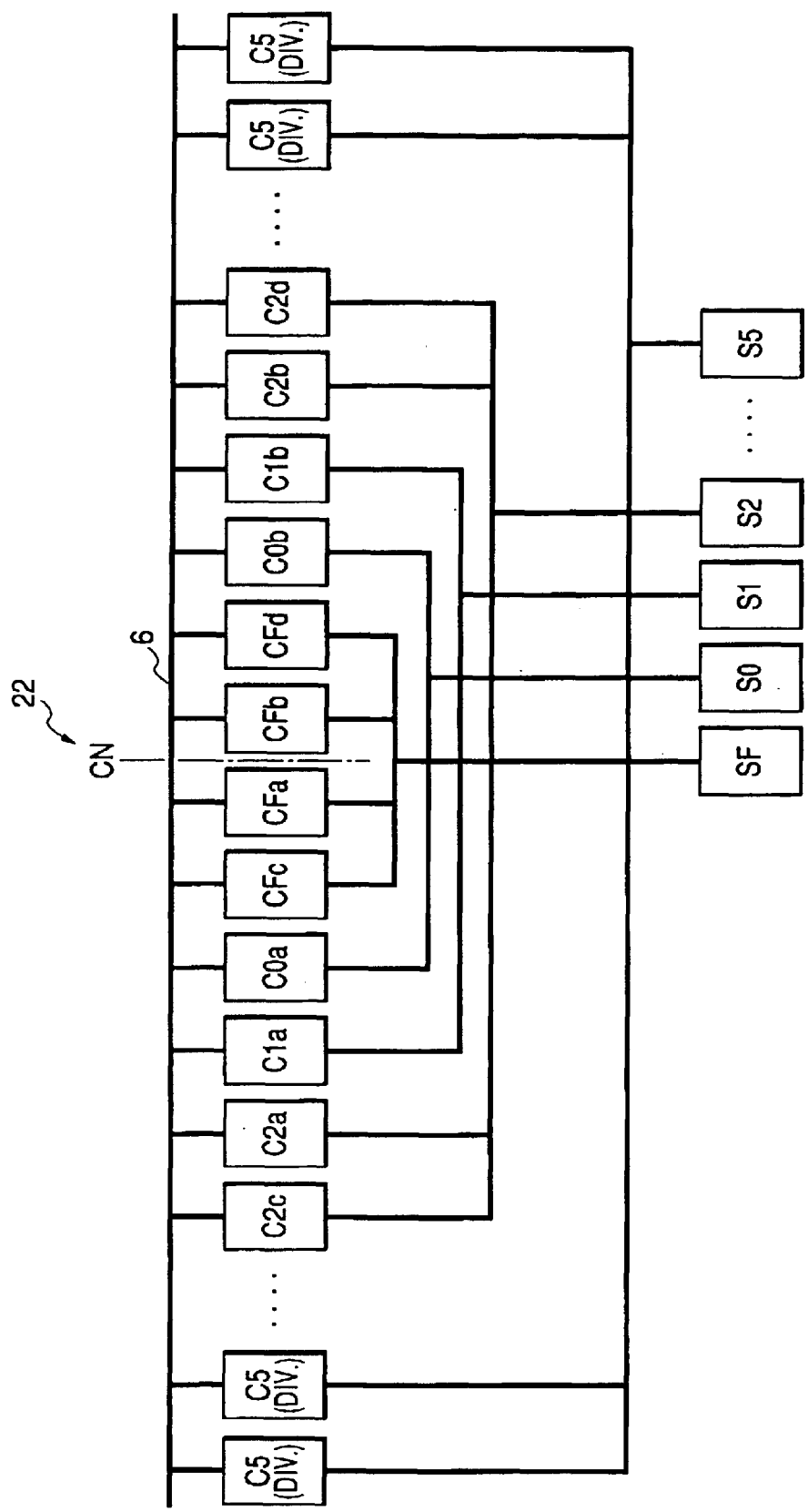
FIG. 9 is a capacitor array for Embodiment 5.

FIG. 9 is an illustration of the capacitor array 22 which is a one-line arrangement similar to FIG. 1 and pairs of CFa & CFb, CFc & CFd, C0a & C0b, C1a & C1b, C2a & C2b, C2c & C2b . . . are disposed in mirror symmetry about CN.

Also according to Embodiment 5, the electric re-distribution error (causing the A/D conversion error) due to the slope of the capacitor film thickness distribution can be made zero theoretically. Further, six switches suffice for switching C0 to C5, thereby reducing a layout area, compared with Embodiment 1 as shown in FIG. 2.

Embodiment 6

Figure 12:
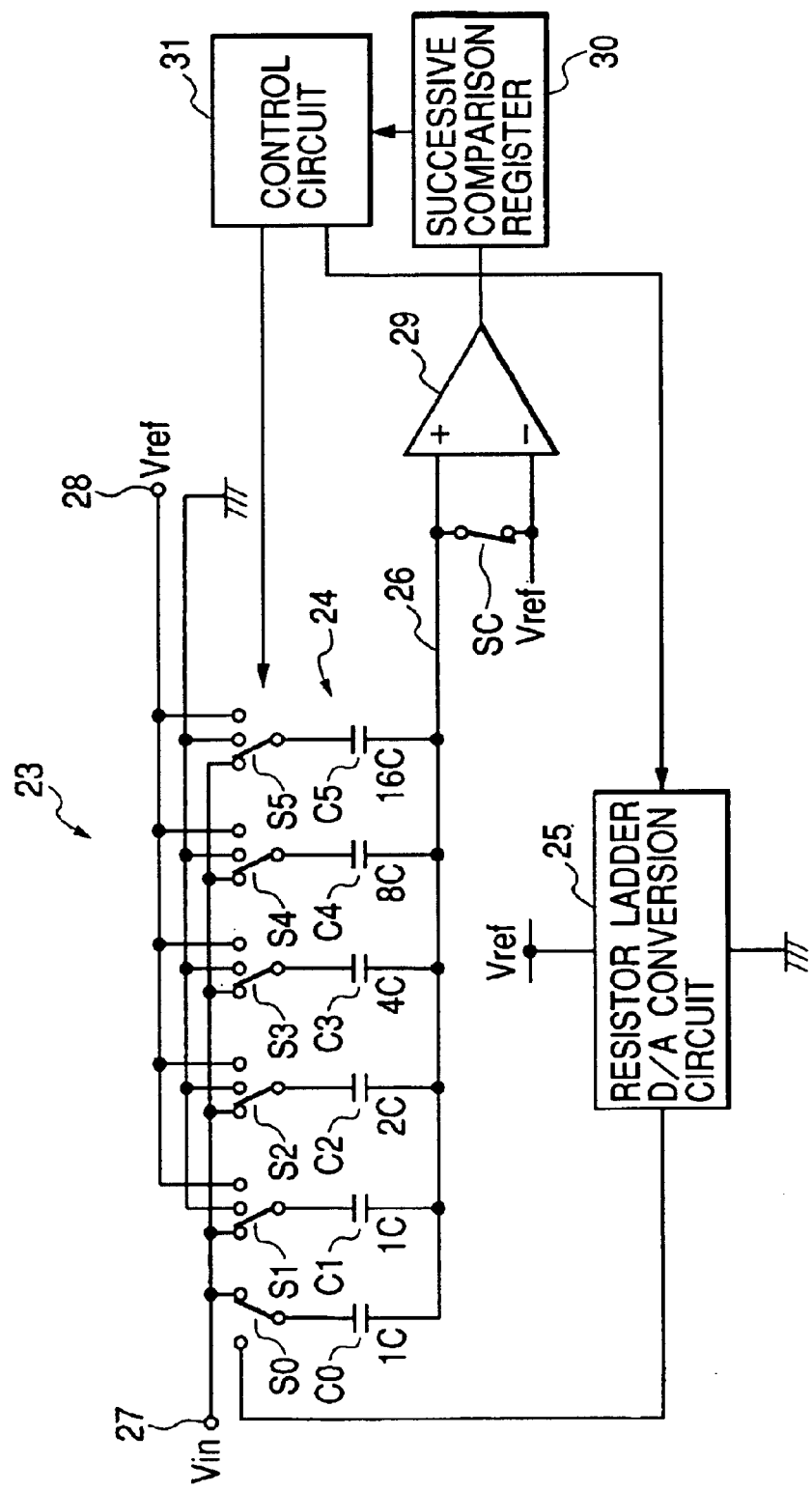
FIG. 12 is a circuit diagram of a successive comparison ADC of Embodiment 6.

FIG. 12 is a circuit diagram of a successive comparison ADC 23 which comprises: a 5-bit capacitor array 24; 4-bit resistor ladder Digital to Analog (D/A) conversion circuit 25. The resolution of the ADC 23 is 9 bits. The resistor ladder D/A conversion circuit 25 comprises: not-shown resistors for dividing Vref, e.g., 5 V, into 16 steps; and not shown switches for outputting each divided Vref.

The capacitor array 24 comprises C0, C1, C2, C3, C4 and C5 of which capacitance values are C, C, 2C, 4C, 8C and 16C, respectively. Actually, C2 to C5 are parallel connections of unit capacitors each of which capacitance is C and moreover the unit capacitor is constructed by two divisional capacitors of which capacitance is C/2.

Figure 11:
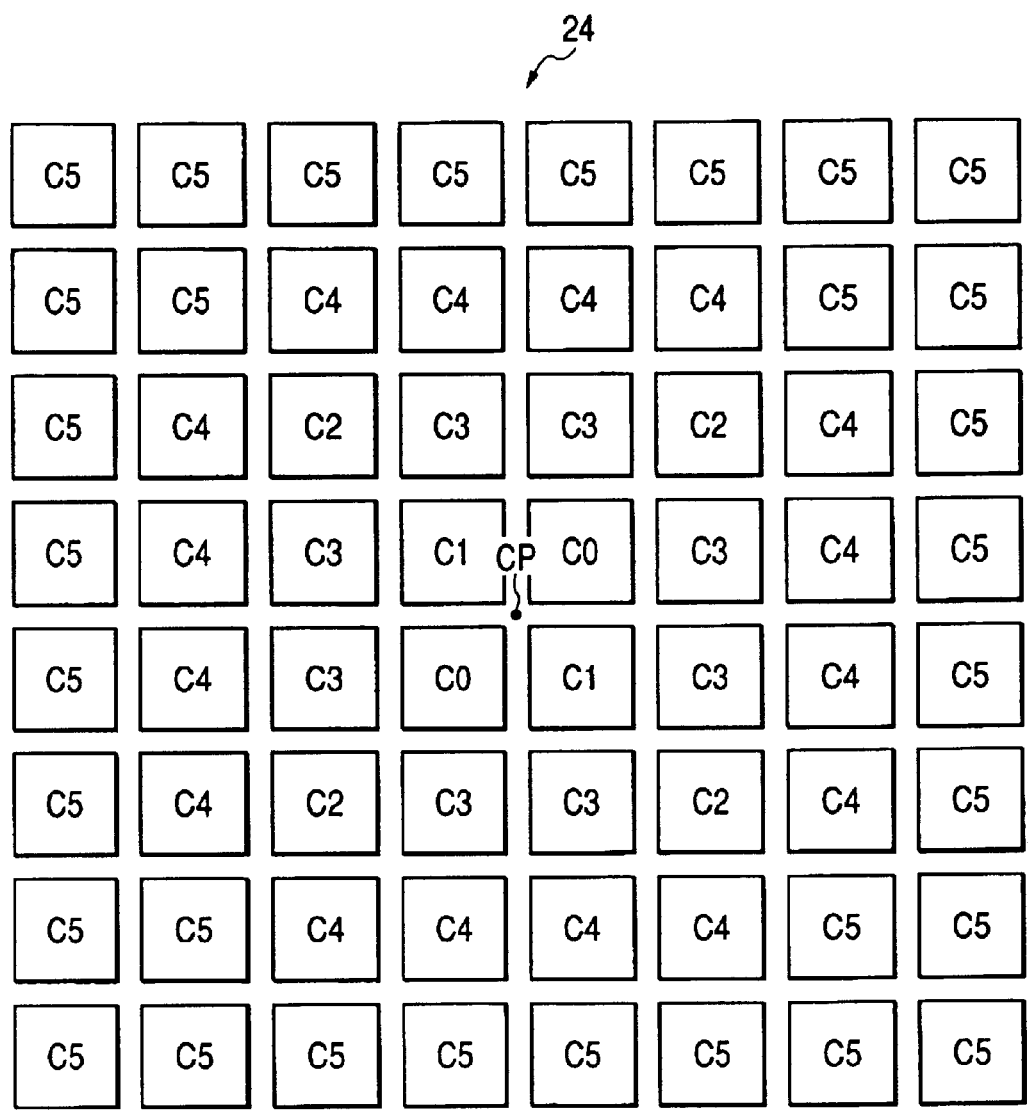
FIG. 11 is an illustration of a capacitor arrangement for Embodiment 6.

FIG. 11 is an illustration of an example of the capacitor array 24 wherein C0 to C5 are constructed by 2, 2, 4, 8, 16 and 32 divisional capacitors, respectively and the divisional capacitors are disposed in the common centroid arrangement about a common center point CP. C0, C1, C2, C3, C4 and C5 in this order are disposed from CP toward the outer side. However, that order is not irrelevant as far as the common centroid arrangement is assured.

In FIG. 12, the lower electrodes (common electrodes) of C1 to C5 are connected with a common line 26, while the upper electrodes thereof are selectively connected with input terminal 27, Vref terminal 28 or GND terminal, through switches S1 to S5. The upper electrode of C0 is selectively connected with the input terminal 27 or output terminal of the resistor ladder D/A conversion circuit 25.

A comparator 29 compares the voltage on the common line 26 with Vref. A switch SC is connected between the input terminals of the comparator 29, while the output terminal thereof if connected with a 9-bit successive comparison register 30. In accordance with the output from the successive comparison register 30, a control circuit 31 switches S0 to S5 and the above-mentioned not-shown switches in the resistor ladder D/A conversion circuit 25.

Thus, a Digital to Analogue converter (DAC) is constructed by the resistor ladder D/A conversion circuit, switches S0 to S5, switch SC and capacitors C0 to C5.

As is well known, the successive comparison ADC 23 successively decides the output from the successive comparison register 30 from MSB to LSB in response to the output from the comparator 29. The resultant A/D conversion code is determined by the electric charge re-distribution of C0 to C5 of which relative capacitance deviations should be reduced.

C0 to C5 are equivalently formed at CP, because the divisional capacitors thereof are disposed in common centroid arrangement. Thus, the relative capacitance deviations can be made zero, even when there exists a slope in the capacitor film thickness. Thus, the electric charge re-distribution error due to the above-mentioned slope which causes the A/D conversion error can be reduced.

Embodiment 7

Figure 13:
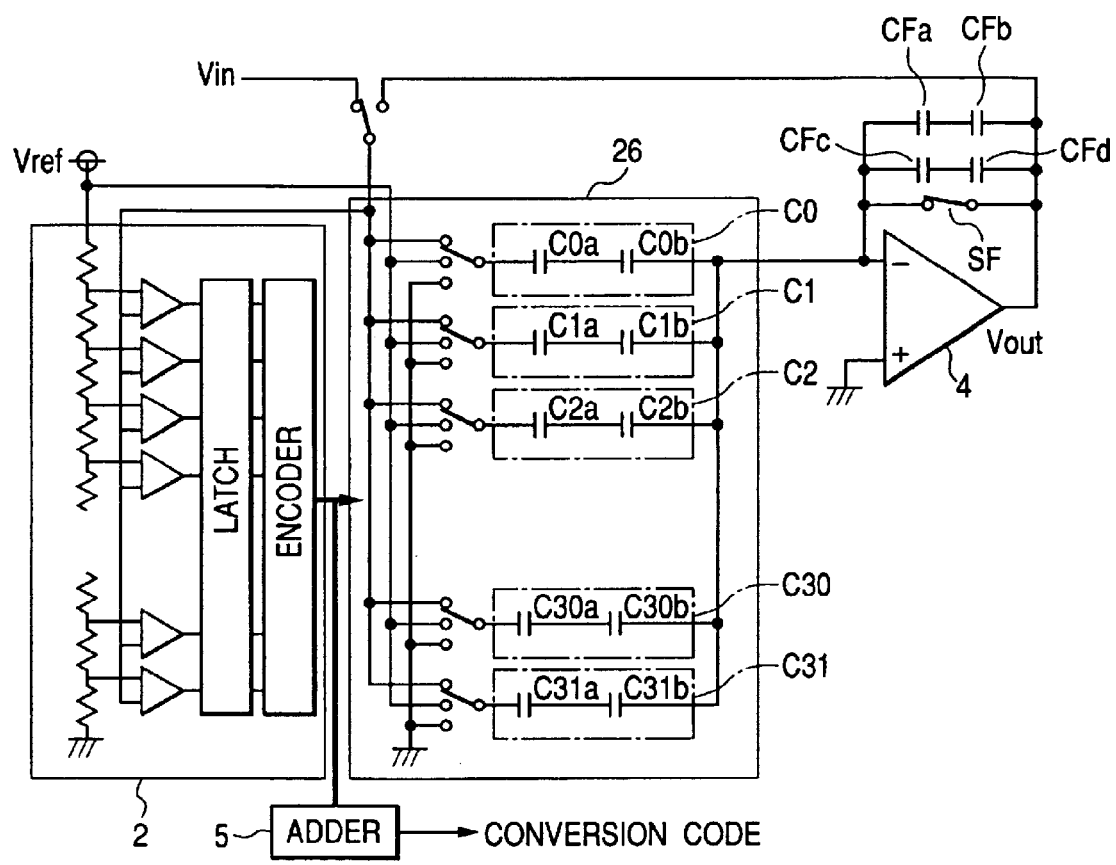
FIG. 13 is a circuit diagram of an ADC converter of Embodiment 7.
Figure 14:
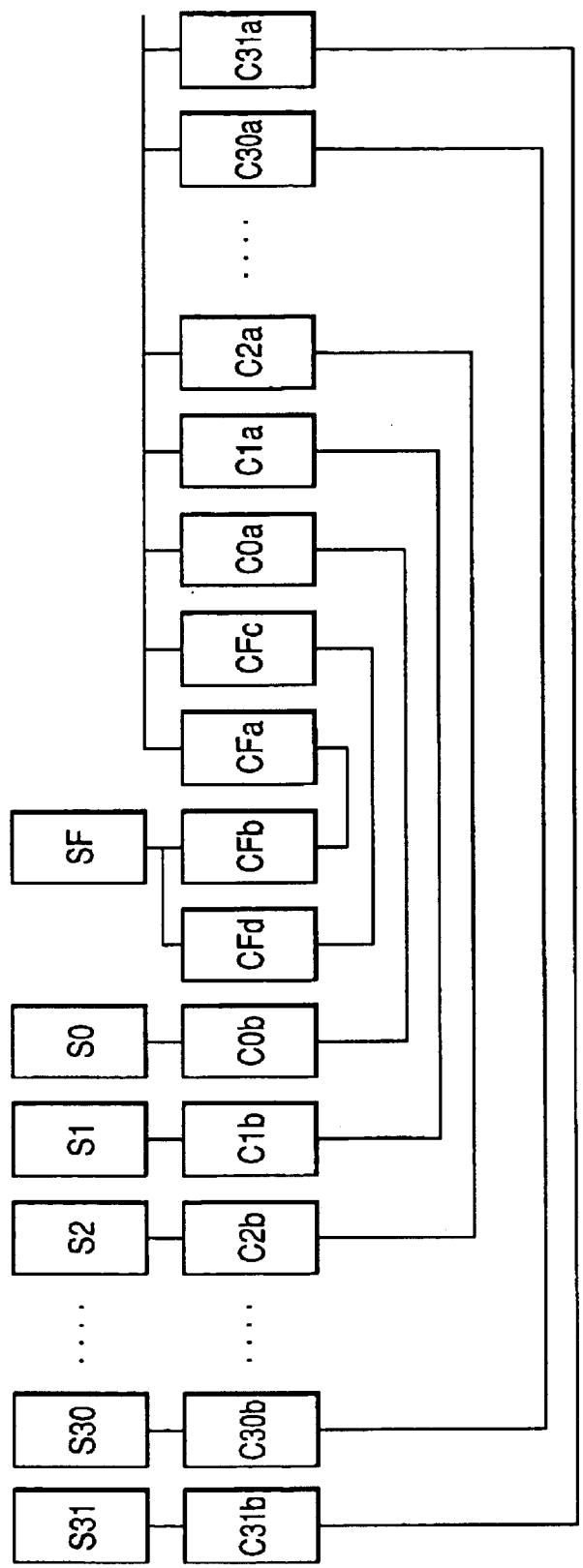
FIG. 14 is an illustration of a capacitor arrangement for Embodiment 7.

FIG. 13 is a circuit diagram of an ADC of Embodiment 7 which is similar to that of Embodiment 1, but a capacitor array 26 is different.

In general, it is required that a charging speed of the capacitors in the capacitor array is raised for a high speed conversion. Here, the charging time is proportional to the capacitance and inversely proportional to an on-switch resistance of a switch connected to the capacitor. Accordingly, it is advantageous for the high speed conversion to reduce the capacitance.

However, if a capacitor area is made smaller in order to reduce its capacitance, the accuracy of the capacitance values are apt to be lowered due to random fluctuations in the capacitance values caused by accuracy in manufacturing processes.

On the other hand, the unit capacitors C0 to C31 as shown in FIG. 13 is series connections of the divisional capacitors Cia and Cib (i=0 to 31), without reducing the area of the divisional capacitors. For example, if the capacitance values of the divisional capacitors are "2C", then the capacitance values of the unit capacitors become "C".

Further, the capacitance deviations due to the slope in the film thickness distribution are cancelled by the series connection of the $2^n$ divisional capacitors disposed in common centroid symmetry.

Actually, the capacitance deviation $\Delta C$ of the series connection of Ca and Cb due to the deviations $\Delta Ca$ and $\Delta Cb$ of Ca and Cb, respectively is expressed by:

$$\Delta C = Cb^2/(Ca+Cb)^2 \cdot \Delta Ca + Ca^2/(Ca+Cb)^2 \cdot \Delta Cb$$
$$= 1/4 \cdot (\Delta Ca + \Delta Cb)$$

if Ca and Cb are of the same shape.

Therefore, $\Delta Ca$ becomes minus $\Delta Cb$, when there is a slope in the film thickness distribution of the capacitor insulators, if Ca and Cb are disposed in mirror symmetry or common centroid arrangement. Thus, $\Delta C$ becomes zero.

Embodiment 8

Figure 15:
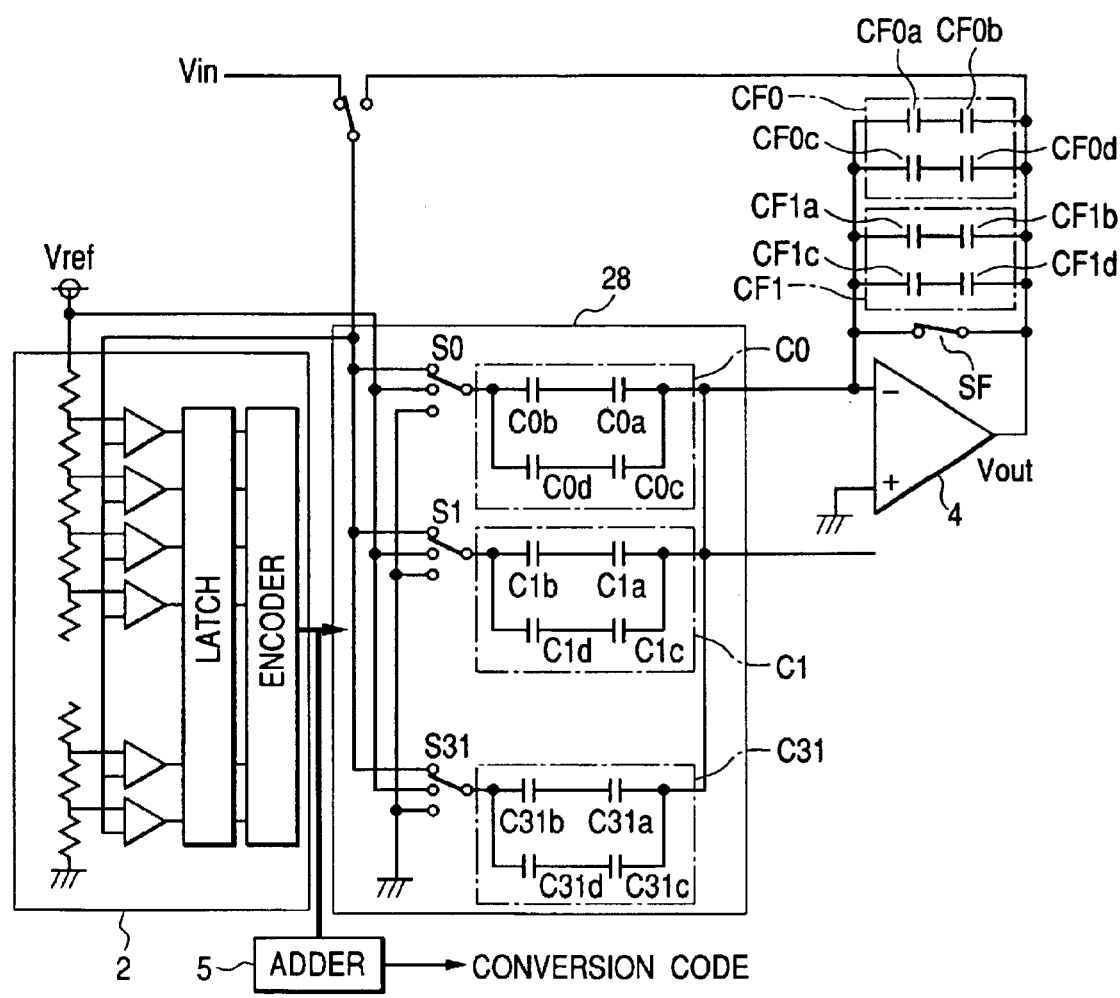
FIG. 15 is a circuit diagram of an ADC converter of Embodiment 8.

FIG. 15 is a circuit diagram of an ADC of Embodiment 8 which is similar to that of Embodiment 1, but a capacitor array 26 is different from that of Embodiment 1.

Figure 16:
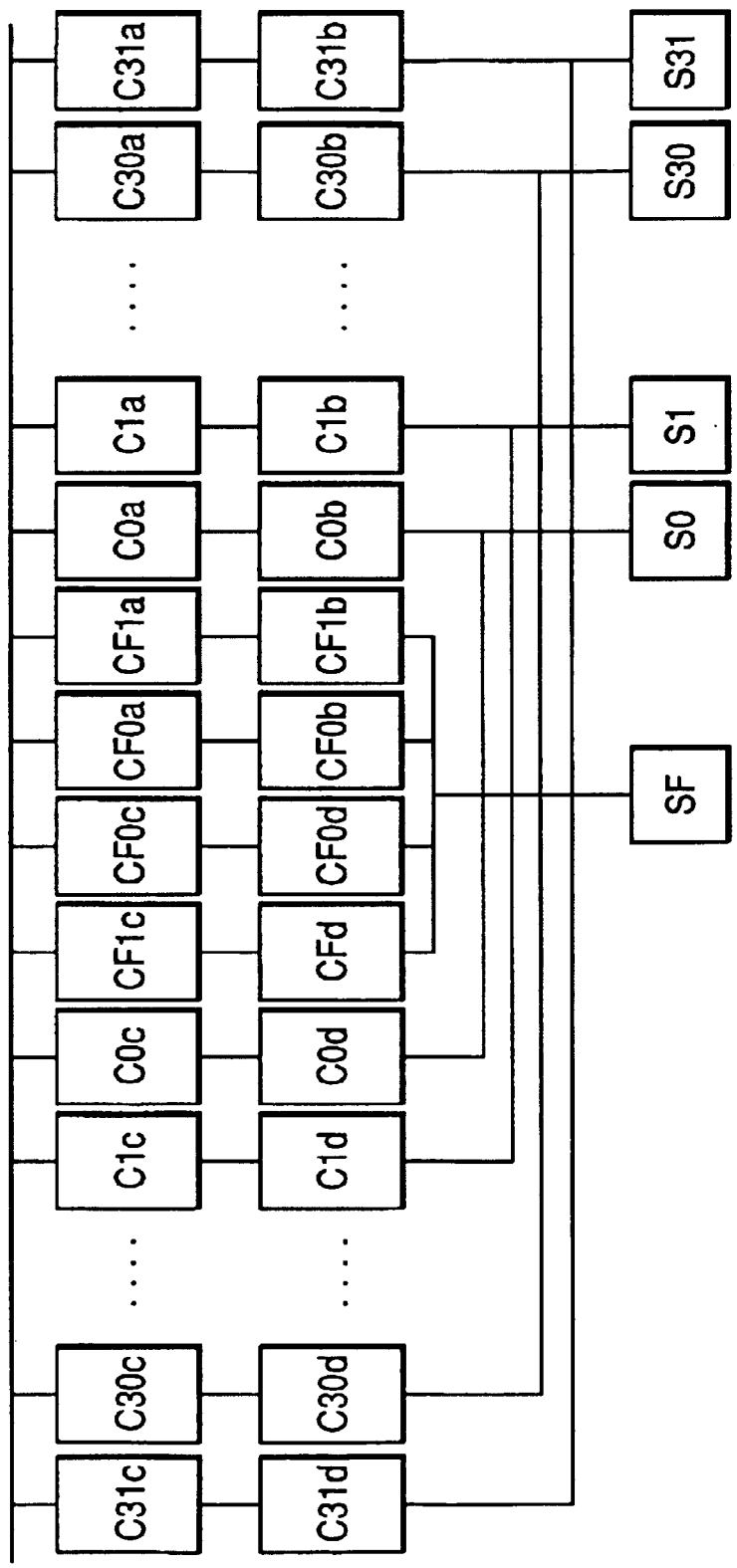
FIG. 16 is an illustration of a capacitor arrangement for Embodiment 8.

The unit capacitor is a parallel connections of $2^j$ divisional capacitors each of which is a series connection of $2^j$ divisional capacitors. In the example as shown in FIG. 16, "j" is two. However, in general, the unit capacitor may be a parallel connections of $2^i$ divisional capacitors each of which may be a series connection of $2^j$ divisional capacitors, where "i" is equal to "j", or "i" may not be equal to "j", in general.

The unit capacitor C0 in Embodiment 1 was a parallel connection of the divisional capacitors C0a and C0b. Accordingly, the capacitance values of the divisional capacitors C0a and C0b are "C/2". Therefore, as a number of divisional capacitors increases, the areas thereof disadvantageously decrease. On the contrary, due to the capacitor arrangement of series and parallel connections as shown in FIG. 16, the capacitance deviation due to the film thickness slope can be cancelled without lowering the accuracy of the capacitance value.

The capacitor arrangement as shown in FIG. 16 is appllied both to the mirror symmetry arrangement and common centroid arrangement.

Other Embodiment

The present invention is not limited to the above-explained Embodiments, but is modified and extended as follows.

For example, the above-explained multiplying D/A converter can be applied not only to a cyclic Digital to Analogue converter (DAC), cyclic ADC and successive comparison ADC, but also to a pipe-line ADC and serial-parallel ADC.

Further, dummy capacitors may be provided at the outer edges or sides of the capacitor array in order to make the electrical conditions of the divisional capacitors uniform inside and outside the capacitor array, thereby reducing capacitance deviations of the divisional capacitors disposed at the edges or periphery of the capacitor array.

Further, the unit capacitor may be constructed not only by 2 or 4 divisional capacitors, but also by 8, 16, . . . , in general, $2^n$ capacitors.

Further, the divisional capacitors may be linearly arranged in three or four, . . . , in general a plurality of rows. Further, when a plurality of rows is employed, mirror symmetry arrangement may be employed in place of the common centroid arrangement of Embodiments 3 and 4.

What is claimed is:

1. A D/A converter which comprises:
a capacitor array for storing electric charges in accordance with a digital voltage signal; and
an operational amplifier of which input terminal is connected with said capacitor array and amplifies a voltage which corresponds to said electric charges,
wherein said capacitor array comprises a plurality of unit capacitors which comprises $2^n$ divisional capacitors which are of the same shape and are connected in parallel, where "n" is a prescribed natural number.

2. The D/A converter according to claim 1, wherein:
said divisional capacitors are linearly disposed in mirror symmetry about a center line perpendicular to a longitudinal direction of the linear disposition; and
one half of said divisional capacitors every unit capacitor is disposed at one side of said center line and another half of said divisional capacitors every unit capacitor is disposed at the another side of said center line.

3. The D/A converter according to claim 1, wherein said divisional capacitors are arranged in a plurality of rows and in center symmetry about a center point of said capacitor array.

4. The D/A converter according to claim 1, wherein:
one of electrodes of each of said divisional capacitors is connected with a common line; and
one half of said divisional capacitors every unit capacitor is disposed at one side of said common line and another half of said divisional capacitors every unit capacitor is disposed at the another side of said common line.

5. The D/A converter according to claim 1, wherein dummy capacitors are disposed at edges or sides of said capacitor array.

6. The D/A converter according to claim 1, wherein:
one of electrodes of each of said divisional capacitors is connected with a common line; and
another electrode of each of said divisional capacitors is selectively connected with a prescribed reference voltage terminal or ground voltage terminal, in accordance with said digital voltage signal.

7. The D/A converter according to claim 1, which further comprises another set of unit capacitors which are connected between an output terminal and said input terminal of said operational amplifier.

8. The D/A converter according to claim 1, wherein said divisional capacitors are classified into "m" capacitors of which capacitance values are C, C, 2C, . . . and $2^{(m-1)}C$, where "C" is a prescribed capacitance and "m" is a bit number of said digital voltage signal.

9. An A/D converter, which comprises:
an A/D conversion circuit for converting an input voltage into a digital voltage;
a capacitor array for storing electric charges in accordance with said input voltage; and
an operational amplifier for converting a voltage corresponding to said electric charges into an analogue voltage,
wherein:
said capacitor array comprises a plurality of unit capacitors which comprises $2^n$ divisional capacitors which are of the same shape, where "n" is a prescribed natural number;
one-side electrodes of said unit capacitors are selectively connected with a prescribed reference voltage terminal or ground voltage terminal in accordance with said digital voltage, while the other-side electrodes of said unit capacitors are connected with an inverting terminal of said operational amplifier; and
said A/D conversion circuit converts said input voltage into said digital voltage on the basis of the prescribed reference voltage.

10. A D/A converter which comprises:
a capacitor array for storing electric charges in accordance with a digital voltage signal; and
an operational amplifier of which input terminal is connected with said capacitor array and amplifies a voltage which corresponds to said electric charges,
wherein said capacitor array comprises a plurality of unit capacitors which comprises an even number of divisional capacitors which are of the same shape.

11. A D/A converter according to claim 10, wherein the divisional capacitor comprises $2^i$ sub-divisional capacitors which are of the same shape and are connected in series, where "i" is a prescribed natural number.

12. A D/A converter according to claim 10, wherein the divisional capacitor comprises $2^j$ sub-divisional capacitors which are of the same shape and are connected in parallel, where "j" is a prescribed natural number.

13. A D/A converter according to claim 10, wherein the divisional capacitor comprises:
$2^i$ sub-divisional capacitors which are of the same shape and are connected in series, where "i" is a prescribed natural number; and
$2^j$ sub-divisional capacitors which are of the same shape and are connected in parallel, where "j" is a prescribed natural number.

14. The D/A converter according to claim 13, wherein said "i" is equal to said "j".

15. The D/A converter according to claim 10, wherein:
said divisional capacitors are linearly disposed in mirror symmetry about a center line perpendicular to a longitudinal direction of the linear disposition; and
one half of said divisional capacitors every unit capacitor is disposed at one side of said center line and another half of said divisional capacitors every unit capacitor is disposed at the another side of said center line.

16. The D/A converter according to claim 10, wherein said divisional capacitors are arranged in a plurality of rows and in center symmetry about a center point of said capacitor array.

17. The D/A converter according to claim 10, wherein:
one of electrodes of each of said divisional capacitors is connected with a common line; and
one half of said divisional capacitors every unit capacitor is disposed at one side of said common line and another half of said divisional capacitors every unit capacitor is disposed at the another side of said common line.

18. The D/A converter according to claim 10, wherein dummy capacitors are disposed at edges of said capacitor array.

19. The D/A converter according to claim 10, wherein:
one of electrodes of each of said divisional capacitors is connected with a common line; and
another electrode of each of said divisional capacitors is selectively connected with a prescribed voltage terminal or ground voltage terminal, in accordance with said digital voltage signal.

20. The D/A converter according to claim 10, which further comprises another set of unit capacitors which are connected between an output terminal and said input terminal of said operational amplifier.

21. The D/A converter according to claim 1, wherein said divisional capacitors are classified into "m" capacitors of which capacitance values are C, C, 2C, . . . and $2^{(m-1)}C$, where "C" is a prescribed capacitance and "m" is a bit number of said digital voltage signal.

22. A D/A converter which comprises:
a capacitor array for storing electric charges in accordance with a digital voltage signal; and
an operational amplifier of which input terminal is connected with said capacitor array and amplifies a voltage which corresponds to said electric charges,
wherein:
said capacitor array comprises a plurality of unit capacitors which comprises an even number of divisional capacitors which are of the same shape; and
the divisional capacitor comprises $2^i$ sub-divisional capacitors which are of another shape and are connected in series, where "i" is a prescribed natural number.

23. A D/A converter which comprises:
a capacitor array for storing electric charges in accordance with a digital voltage signal; and
an operational amplifier of which input terminal is connected with said capacitor array and amplifies a voltage which corresponds to said electric charges,
wherein:
said capacitor array comprises a plurality of unit capacitors which comprises an even number of divisional capacitors which are of the same shape;
the divisional capacitor comprises $2^i$ sub-divisional capacitors which are of another same shape and are connected in series; and
$2^j$ of said divisional capacitors are connected in parallel, where "j" is a prescribed natural number.

24. An A/D converter, which comprises:
an A/D conversion circuit for converting an input voltage into a digital voltage;
a capacitor array for storing electric charges in accordance with said input voltage; and
an operational amplifier for converting an input voltage into an analogue voltage which corresponds to said electric charges,
wherein:
said capacitor array comprises a plurality of unit capacitors which comprises an even number of divisional capacitors which are of the same shape;
the divisional capacitor comprises $2^i$ sub-divisional capacitors which are of another same shape and are connected in series, where "i" is a prescribed natural number;
$2^j$ of said divisional capacitors are connected in parallel, where "j" is a prescribed natural number;
one-side electrodes of said unit capacitors are selectively connected with a reference voltage terminal or ground voltage terminal in accordance with said digital voltage signal, while the other-side electrodes of said unit capacitors are connected with an input terminal of said operational amplifier; and
said A/D conversion circuit converts said input voltage into said digital voltage on the basis of the prescribed reference voltage.

* * * * *